United States Patent [19]

Pellegrino et al.

[11] Patent Number: 4,587,000

[45] Date of Patent: May 6, 1986

[54] ELECTROPLATING METHOD AND APPARATUS FOR ELECTROPLATING HIGH ASPECT RATIO THRU-HOLES

[76] Inventors: Peter P. Pellegrino, 216 Edgewood La., Apple Valley, Minn. 55124; Damian Pellegrino, 17029 Harbor Bluff Cir., Huntington Beach, Calif. 92649

[21] Appl. No.: 672,601

[22] Filed: Nov. 19, 1984

[51] Int. Cl.⁴ .................................................. C25D 17/00
[52] U.S. Cl. ...................................... 204/273; 204/275; 204/276
[58] Field of Search ............... 204/273, 275, 276, 277, 204/278

[56] References Cited

U.S. PATENT DOCUMENTS

| | | | |
|---|---|---|---|
| 3,424,667 | 1/1969 | Frank | 204/273 |
| 3,503,856 | 3/1970 | Blackmore | 204/273 |
| 3,798,136 | 3/1974 | Olsen | 204/15 |
| 4,139,429 | 2/1979 | Steward | 204/237 |
| 4,174,261 | 11/1979 | Pellegrino | 204/273 |
| 4,443,304 | 4/1984 | Eidschun | 204/222 |

Primary Examiner—T. M. Tufariello
Attorney, Agent, or Firm—Blakely, Sokoloff, Taylor & Zafman

[57] ABSTRACT

Electroplating apparatus and methods for plating high aspect ratio thru-holes in printed circuit boards and the like. For copper plating thru-holes in printed circuit boards, the printed circuit board is immersed in a tank of electrolyte. Surrounding both sides of the printed circuit board are a plurality of cell-like structures which contain mechanical electrolyte agitating members, filters and electrolyte ion replenishment anode baskets. In addition, a pump is provided to encourage exhausting of the electrolyte from local regions of each side of the printed circuit board to encourage a general but definite flow of electrolyte through any thru-holes in the printed circuit board. The general flow of electrolyte as encouraged by the pump is through the ion replenishment anode basket to the mechanical agitator adjacent the printed circuit board, through any thru-holes in that region of the printed circuit board and to some extent around the printed circuit board, past the mechanical agitator on the other side of the printed circuit board and through a filter adjacent the exhaust manifold for recirculation back and forth through similar cells disposed along the length of the circuit board. The mechanical agitation avoids ion depletion in the electrolyte adjacent the printed circuit board and particularly adjacent the edges of and within the thru-holes by assuring fast and continuous interchange of the "surface" electrolyte with the bulk electrolyte, which itself is replenished at an adequate rate by the background flow established by the pump. Alternate methods and apparatus are also disclosed.

14 Claims, 4 Drawing Figures

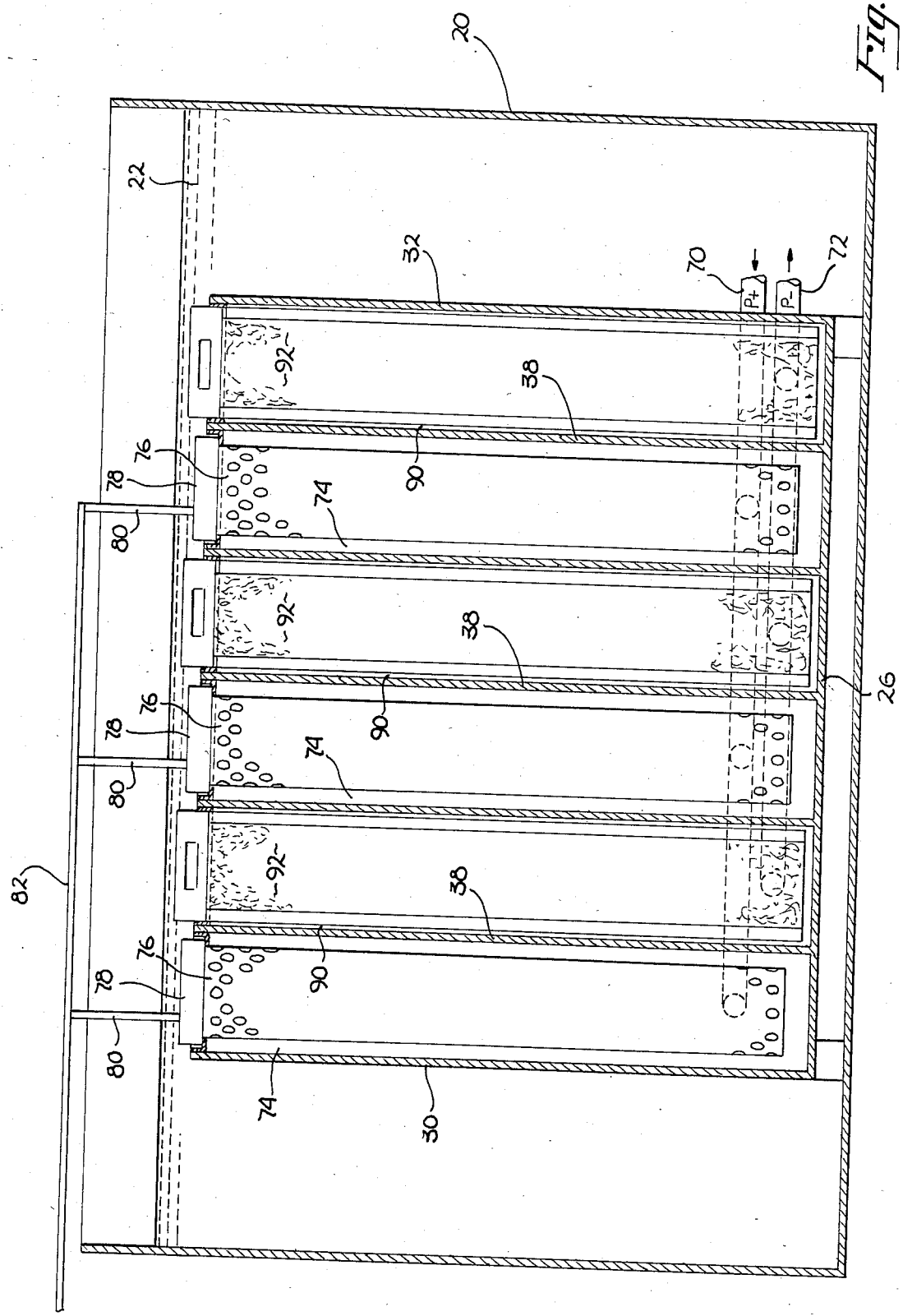

ELECTROPLATING METHOD AND APPARATUS FOR ELECTROPLATING HIGH ASPECT RATIO THRU-HOLES

BACKGROUND OF THE INVENTION

1. Field of The Invention.

The present invention relates to electroplating apparatus and methods, and more particularly the methods and apparatus for the plating of printed circuit board thru-holes and the like.

2. Prior Art.

For various reasons, the proper plating of thru-holes in printed circuit boards is an important aspect of the fabrication of certain types of printed circuits. In particular, far superior mechanical and electrical connection may be made to electronic component leads if the printed circuit board through holes are suitably copper plated, as the soldered bond to the component leads will in general run the entire length of the thru-holes rather than merely the length of whatever solder maniscus there is on the soldered component lead and the face of the printed circuit board on which soldering takes place. Further, in multilayer printed circuit boards, plated through holes are used to make electrical contact with buried printed circuit layers, so that a high quality plating and appropriate copper buildup throughout the entire length of the thru-hole is critical to the accomplishment of high reliability multilayer interconnects. The achievement of such thru-hole plating however is difficult for various reasons. In particular in a conventional plating tank the edges of the mouth of a through hole on a printed circuit board cause particularly high currents and plating rates at that location, effectively depleting the ions in the electrolyte passing into the thru-holes so that the plating rate and plating quality grossly diminish along the depth of the thru-holes depending upon the aspect ratio, that is, the length to diameter ratio of the thru-holes. Consequently, high aspect ratio thru-holes cannot be repeatably and reliably plated using conventional plating methods.

In the prior U.S. Pat. No. 4,174,261, there is disclosed methods and apparatus for providing high and uniform processing rates for electroplating, deplating, etching and the like, substantially independent of the surface geometries of the article subjected to the process. In accordance with that process in an electroplating application, the article to be plated is supported on a cathode so that the electrolyte may be forceably sprayed on the article from an array of spray nozzles adjacent the surface thereof. Intermixed with the array of spray nozzles may be a second array of openings providing suction to locally remove most of the sprayed electrolyte after impingement on the workpiece. The net effect is that fresh electrolyte is constantly being sprayed onto the article being plated, including being sprayed into thru-holes of a printed circuit board, with the spent electrolyte being quickly removed from the workpiece before it has an opportunity to shield the surface thereof from the spray of fresh electrolyte. Functionally, the method and apparatus of that patent work very well, resulting in uniform, very high density plating on flat surfaces, and very good deposition distribution along relatively deep thru-holes in printed circuit boards, not generally achievable with other techniques. The process is less than optimum however from a noise and energy standpoint, as a relatively high pumping power is required to give the best results, and the process itself is relatively noisy, particularly with multiple tanks operating in a typical production environment.

BRIEF SUMMARY OF THE INVENTION

Electroplating apparatus and methods for plating high aspect ratio thru-holes in printed circuit boards and the like. For copper plating thru-holes in printed circuit boards, the printed circuit board is immersed in a tank of electrolyte. Surrounding both sides of the printed circuit board are a plurality of cell-like structures which contain mechanical electrolyte agitating members, filters and electrolyte ion replenishment anode baskets. In addition, a pump is provided to encourage exhausting of the electrolyte from local regions of each side of the printed circuit board to encourage a general but definite flow of electrolyte through any thru-holes in the printed circuit board. The general flow of electrolyte as encouraged by the pump is through the ion replenishment anode basket to the mechanical agitator adjacent the printed circuit board, through any thru-holes in that region of the printed circuit board and to some extent around the printed circuit board, past the mechanical agitator on the other side of the printed circuit board and through a filter adjacent the exhaust manifold for recirculation back and forth through similar cells disposed along the length of the circuit board. The mechanical agitation avoids ion depletion in the electrolyte adjacent the printed circuit board and particularly adjacent the edges of and within the thru-holes by assuring fast and continuous interchange of the "surface" electrolyte with the bulk electrolyte, which itself is replenished at an adequate rate by the background flow established by the pump. Alternate methods and apparatus are also disclosed.

BRIEF DESCRIPTION OF THE DRAWINGS

FIG. 4 is a cross section taken along line 4—4 of FIG. 1.

DETAILED DESCRIPTION OF THE INVENTION

Figure 1:
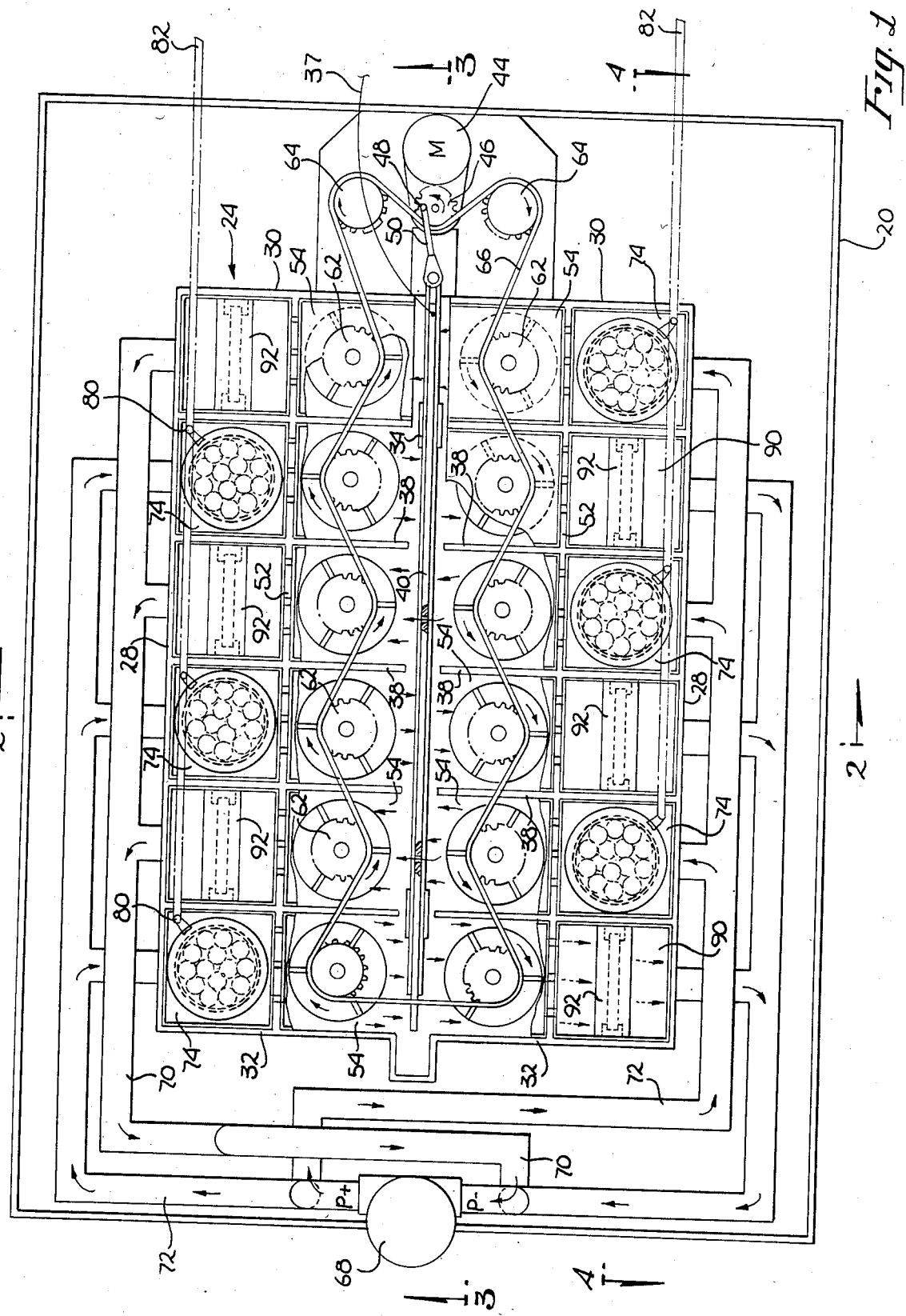
FIG. 1 is a top view of the plating apparatus of the present invention with the covers over the various cells partially cut away to provide a top view of the internal structure thereof.

First referring to FIGS. 1, 2, 3 and 4, a top view with part of the covers cut away and various cross sections through the electroplating apparatus of the preferred embodiment of the present invention may be seen. An outer tank 20 provides the main containment for the electrolyte 22, the tank 20 being generally open at the top except for some form of dust cover one may choose to use therewith, not shown. Mounted within tank 20 is an inner tank-like structure generally indicated by the numeral 24. The inner tank-like structure is comprised of a bottom 26, sidewalls 28 and end walls 30 and 32. Fastened to the bottom wall 26 is a channel-like member 34, preferably fabricated from some suitable plastic such as Delrin or the like. A similar slot 36 is positioned near the upper portion of the inner tank 24, being retained in position by engagement with transverse walls 38 at an elevation which will allow some flow of electrolyte over the top of the channel member.

The printed circuit board 40 to be plated is fastened within a small frame-like rack 42 so that the printed circuit board and frame-like rack may readily slide as a unit in a longitudinal direction along channel members 34 and 36, electrical contact being made to the printed circuit board through lead 37. A gear motor 44 is provided adjacent the end of outer tank 20 at an elevation above the electrolyte level to drive a sprocket 46 in rotation, which in turn will cause reciprocation of the printed circuit board and frame-like rack through the crank pin 48 and connecting rod 50. The reciprocating drive for the printed circuit board is shown entirely above the electrolyte level, though if desired, particularly depending upon the proportions and size of the printed circuit board, the crank pin and connecting rod drive may readily be located midway within the tank, or a second drive may be located adjacent the bottom of the tank, as plastic members may readily be used for this drive mechanism to avoid any plating thereon when located beneath the electrolyte level.

Figure 2:
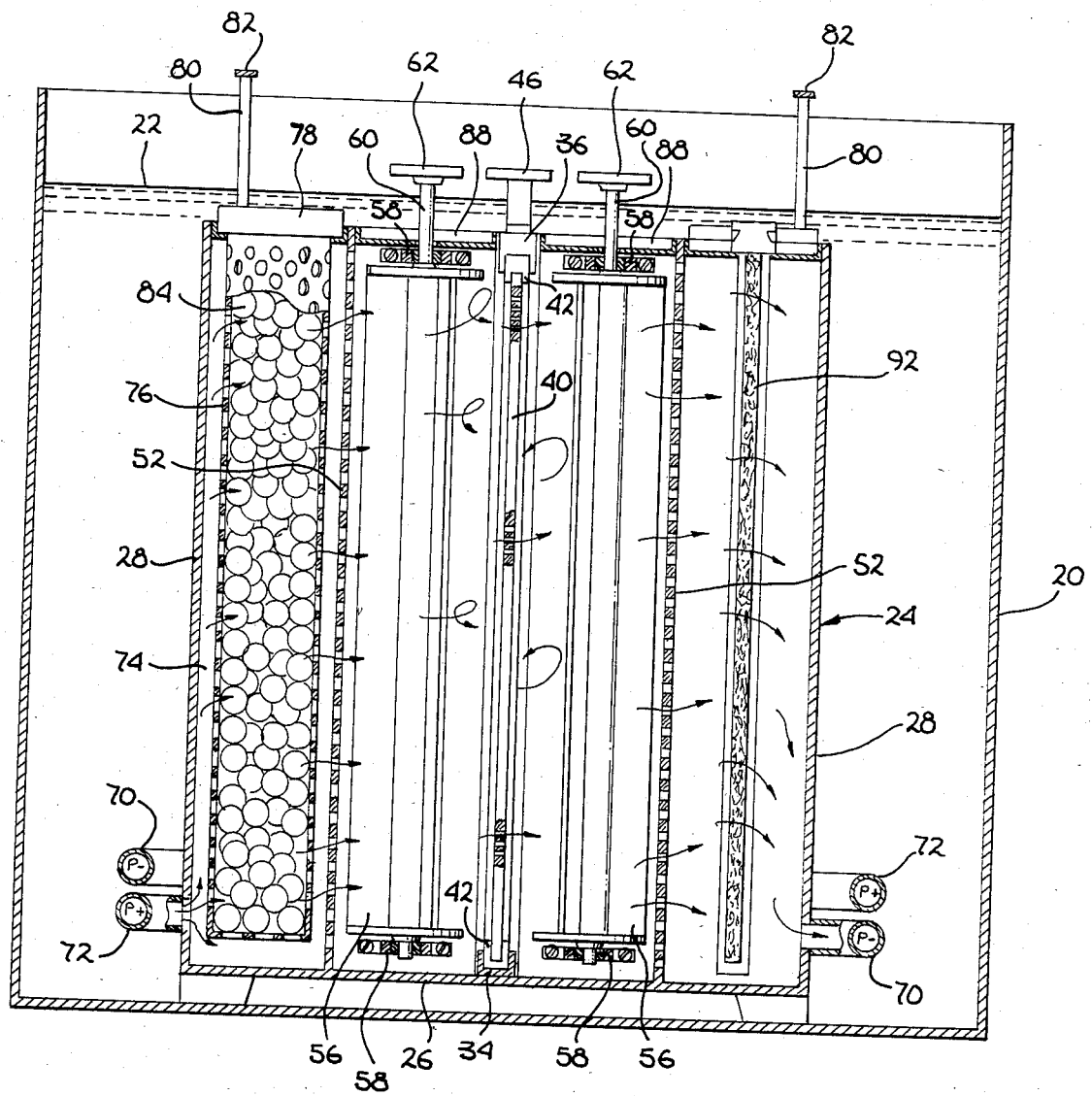
FIG. 2 is a cross section taken along line 2—2 of FIG. 1.
Figure 3:
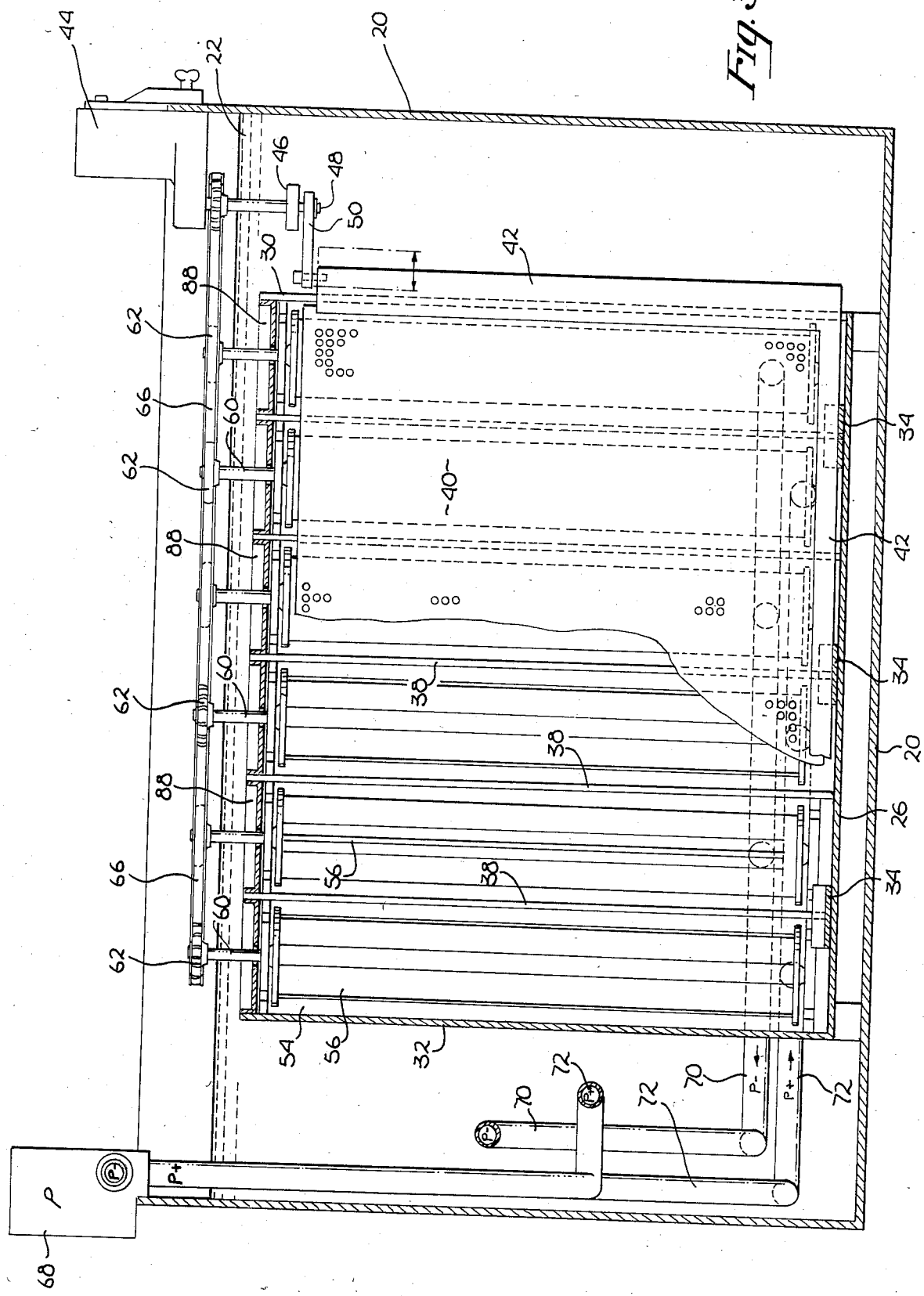
FIG. 3 is a cross section taken along line 3—3 of FIG. 1.

As may be seen in FIG. 1, the inner tank structure 24 is divided up into a plurality of substantially square cell regions by the plurality of transverse walls 38 and longitudinal walls 52. The transverse walls 38 are preferably solid walls, that is, substantially impervious to electrolyte, though the longitudinal walls 52, as may be seen in FIG. 2, are generally provided with a predetermined porosity to allow the relatively uniform flow of electrolyte therethrough. In that regard, the longitudinal walls 52 could be eliminated if desired, though their presence is preferred as they provide an improved flow control, as shall subsequently be described in greater detail.

Located within each of the inner cells 54 is a paddle wheel-like assembly 56, being supported on simple journal bearings 58 at the top and bottom thereof, with the center shaft 60 thereon extending above the electrolyte level and each having sprockets 62 at the top end thereof. These paddle wheels also are preferably fabricated using a material which will not be active in the plating process such as, by way of example, a plastic or nonreactive metal, such as stainless steel, monel or titanium. Extending around sprocket 46, idler sprockets 64 and sprockets 62 is a bicycle chain 66, so that the drive motor 44 causing the reciprocating motion of the printed circuit board also causes rotation of the paddle-like assemblies 56 in each of the inner cells to cause the electrolyte therein to have substantial agitation. This has the affect of avoiding ion depletion in the layers of electrolyte adjacent the printed circuit board surface by causing substantial and relatively immediate interchange between the bulk electrolyte in these inner cells and the otherwise relatively stagnant surface electrolyte adjacent the surface of the of the printed circuit board. Thus, one of the objectives of the present invention is achieved by the agitation of the paddle-like assemblies, specifically the substantially avoidance of ion depletion in the electrolyte adjacent the printed circuit board being plated. Obviously, while the extent of agitation adjacent the surface of the printed circuit board may vary somewhat along the length of the printed circuit board, the simultaneous reciprocation of the printed circuit board assures that no part of the circuit board spends any significant time in sheltered or slow moving electrolyte.

In addition to the agitation of the electrolyte provided by the paddle assemblies 56, a general flow direction for the electrolyte is established by electrolyte pump 68, being supplied with electrolyte through lines 70 connected to the inner tank structure 24 and delivering electrolyte to the inner tank structure through lines 72. As may be perhaps best seen in FIGS. 1 and 2, the electrolyte is first delivered to cells 74 which function as ion replenishment cells. These cells contain a porous basket-like structure 76 (see particularly FIGS. 3 and 4) within which are placed pieces of copper 84 for replenishment of the copper ions in the plating solution. The baskets 76 in the preferred embodiment are fabricated from an electrically conductive material which is substantially inactive to the electrical process such as, by way of example, monel, stainless steel or titanium, as mentioned before. As an alternative, the baskets may be fabricated from plastic so long as they contain some means of making electrical contact to the pieces of copper 84 therein, such as by way of a conductive rod extending down into the basket. The top of the baskets are closed by members 78, with electrical connection being made thereto through electrodes 80 connected to horizontal bus bars 82 located well above the electrolyte level. The copper in the baskets thus serves as the anode for the electroplating process, with pump 68 first delivering electrolyte through these cells for ion replenishment.

The electrolyte then proceeds through the adjacent wall 52 (see particularly FIGS. 2 and 3) passing into the regions of agitated flow caused by the rotation of the paddle assembly 56 therein. In that regard, wall 52 is provided with a predetermined porosity to somewhat restrict the flow therethrough, so that the flow is relatively uniformly distributed across the entire area of the wall, rather than perhaps being more concentrated adjacent the inlet 72. The paddle assemblies further generally rotate with sufficient velocity to break up the flow quite well, so that the flow in the region of the paddle assembly and adjacent the printed circuit board 40 is quite turbulent, providing a rapid electrolyte exchange between the electrolyte adjacent the surface of the printed circuit board and the bulk electrolyte in the paddle cells.

The paddle cells 54 are also generally closed at the top thereof by closure members 88, so that the flow encouraged by pump 68 is a flow toward the face of the printed circuit board. This causes the electrolyte to also have a general flow through the thru-holes in the printed circuit board, assuring a constant flow of fresh electrolyte therethrough. Obviously the volume of flow through the printed circuit holes will of course depend upon the number and size of the holes in the printed circuit board. However, sufficient room for electrolyte flow is provided around the ends and over the top of the printed circuit board to control (limit) the pressure buildup on the face of the printed circuit board, so that the flow through the holes in the printed circuit board will be relatively uniform independent of the particular number and size of the holes in that circuit board region.

The flow through the holes in the printed circuit board and around the edges of the printed circuit board proceeds into the turbulent region of the paddle cell on the opposite side of the printed circuit board, so that the flow on the "back" side of the printed circuit board is constantly broken up and made turbulent. Actually, in the preferred embodiment, the "back" of the printed circuit board has no real such identity because of the extent of oscillation of the printed circuit board in the tank. In particular, as may be best seen in FIG. 1, flow through adjacent cells along the length of the board is in opposite directions. Consequently, oscillation of the board so that all parts of the board oscillate between at least two adjacent cells will cause all surfaces of the board to spend substantially equal time in the regions of flow of each of the two directions. In this manner no region of the board is given, on an average basis, any preferred or sheltered positions, so that plating is very uniform across both surfaces of the board.

Finally, the flow through the paddle cell on the "back" of the board proceeds through the adjacent wall 52 to filter cells 90, each of which contain a simple rectangular filter strip 92 for removing particulate matter from the electrolyte prior to the electrolyte's return to the pump 68. These filter cells also are closed at the top so that flow is encouraged through the inner tank structure as described, not only by the increased pressure at the delivery side of pump 68, but also by the reduced pressure at the inlet thereof which, in effect, becomes communicated to the back side of the board. Obviously, while filtering is preferable to maintain the electrolyte free of contaminating particulate matter, other types of filtering may readily be used, such as line filters in either lines 70 or 72. The filter cells described are preferred however, as they provide a large filter area, may be easily visually inspected and very easily cleaned and/or replaced as desired.

One of the big advantages of the present invention is its ability to put a high quality copper plating throughout the depth of thru-holes in a printed circuit board of substantially any thickness desired. In particular, prior art plating techniques are generally not well suited for plating of thru-holes, particularly high aspect ratio thru-holes (thru-holes having a substantial length to diameter ratio). Prior art plating techniques are generally dependent upon the diffusion of ions through relatively stagnant electrolyte. Because of the sharp edge at the mouth of a thru-hole, the electric field adjacent the mouth of the thru-hole is substantially higher than in other regions on the face of the printed circuit board or within the thru-hole. As a consequence, the rate of copper build up at the mouth of the thru-hole tends to be greater than in other regions of the printed circuit board. Further, there is very little plating build up and a relatively low quality plating results deeper within the thru-hole, partially because of some stagnation of the electrolyte in that region and more particularly, because of the depletion of the plating ions from the electrolyte at the mouth of the thru-hole as the electrolyte passes through the higher electric fields in those regions. As a result, a high plating rate and thick plating would occur at the mouth of the thru-holes, with the plating well within the thru-holes being particularly thin and frequently of very low quality. Obviously in the case of multilayer boards, the failure of the plating to make positive electrical contact with the intermediate printed circuit board layer may well result in the malfunction or erratic function of an entire system. Adequate plating of high aspect ratio thru-holes in accordance with prior art techniques was most difficult indeed.

In comparison to prior art techniques, the present invention has been found to provide a very uniform, high quality plating throughout the depth of high aspect ratio thru-holes with ease. In fact, depending upon the degree of agitation used, flow rates used, etc., it has been found with the present invention that great rates of plating build up deep within thru-holes may be achieved than on the face of a printed circuit board. Cross sections of experimental plated thru-holes, plated in accordance with the methods and apparatus of the present invention, have shown substantially uniform plating thicknesses throughout the depth of the thru-holes with no meaningful increase in plating thickness at the mouth of the thru-hole. It is believed that the maintenance of a substantial flow through the thru-holes during the plating process prevents any meaningful depletion of the electrolyte at the mouth of the thru-holes as the electrolyte passes therethrough. Further, the effects of the higher electric field at the mouth of the thru-holes appeared to be negated by the present invention because of the substantial absence of the higher plating rates in this area than deeper within the thru-holes. It is believed that this occurs when using the present invention because the agitation and flow of the electrolyte makes ion diffusion under the influence of the electric field only relevant in the very thin film of electrolyte wetting the actual surfaces of the printed circuit board and thru-holes, and the electroplating has sufficient build up so that the sharp mouth regions of the thru-holes are quickly rounded in comparison to this very thin film thickness, to quickly effectively eliminate the higher electric field in that very thin film of electrolyte.

There has been described herein new and unique methods and apparatus for plating printed circuit boards, and particularly thru-holes therein which allows the rapid plating of the thru-holes with a high quality plating of substantially uniform thickness throughout the entire length of the through holes, even for thru-holes of very high aspect ratio. While the invention has been disclosed and described herein with respect to a preferred embodiment of apparatus for practicing the method, it will be understood by those skilled in the art that various changes in form and detail may be made therein without departing from the spirit and scope of the invention. By way of example, the paddle-like agitators may take other forms, such as oscillating agitators, reciprocating agitators and the like. Similarly, the agitators may contain the metal to be plated in internal baskets (proper electrical contact being made thereto) so that separate cells need not be provided therefor. These and other changes do not effect the basic inventive concepts of the invention, and will be obvious to those skilled in the art.

We claim:

1. Plating apparatus for the plating of through holes in a printed circuit board comprising a container for confining a plating solution;

printed circuit board support means for supporting a printed circuit board within said container, said support means including reciprocating means for repetitive movement of said circuit board back and forth in a plane substantially coincident with the plane of the circuit board;

divider means adjacent each side of said printed circuit board support means for alternatively defining first and second cells along each side of said printed circuit board support means;

agitator means within each of said cells for mechanically providing substantial agitation to a plating solution therein; and pump means for delivering plating solution to said first cells and for removing plating solution from said second cells, each of said second cells being substantially opposite one of said first cells, whereby first plating solution will be encouraged to flow from said first cells through the through holes in a printed circuit board on said printed circuit board support means and into said second cells to provide fresh plating solution to the inner surfaces of through holes.

2. The plating apparatus of claim 1 wherein said reciprocating means provides sufficient movement to a printed circuit board in said printed circuit board support means to repetitively bring each area of each surface of the printed circuit board containing through holes into alignment with both first and second cells, whereby flow of plating solution through the through holes on the printed circuit board will repetitively reverse direction.

3. The plating apparatus of claim 1 wherein said agitation means comprises rotating paddle wheels in each of said cells.

4. The plating apparatus of claim 1 for electroplating of through holes in a printed circuit board further comprising
ion replenishment means containing at least one piece of the metal to be plated within the plating solution for replenishing the ion content in the plating solution in said first cells;
first electrode means for providing electrical contact between a first terminal of a power supply and said at least one piece of metal to be plated; and
second electrode means for providing electrical contact between a second terminal of a power supply and the printed circuit board to be plated.

5. The plating apparatus of claim 4 wherein said ion replenishment means comprises baskets containing pieces of the metal to be plated in third cells coupled to said first cells and through which plating solution passes in flowing to said first cells.

6. The plating apparatus of claim 5 further comprised of fourth cells coupled to said second cells and through which plating solution passes in flowing from said second cells to said pump means, said fourth cells containing filter means for filtering of plating solution flowing therethrough.

7. Plating apparatus for the plating of through holes in a printed circuit board comprising
a container for confining a plating solution;
printed circuit board support means for supporting a printed circuit board within said container, said support means including reciprocating means for repetitive movement of said circuit board held in said support means back and forth in a plane substantially coincident with the plane of said circuit board;
divider means adjacent each side of said printed circuit board support means for defining first and second cells along each side of said printed circuit board support means;
agitator means within each of said first cells for mechanically providing substantial agitation to a plating solution therein, and
pump means for delivering plating solution to said first cells and for removing plating solution from said second cells, said second cells each being substantially opposite one of said first cells, whereby fresh plating solution will be encouraged to flow from said first cells through the through holes in a printed circuit board on said printed circuit board support means and into said second cells to provide fresh plating solution to inner surfaces of the through holes.

8. The plating apparatus of claim 7 wherein said reciprocating means provides sufficient movement to a printed circuit board in said printed circuit board support means to repetitively bring each area of each surface of the printed circuit board containing through holes into alignment with both first and second cells, whereby flow of plating solution through the through holes on the printed circuit board will repetitively reverse direction.

9. The plating apparatus of claim 7 wherein said agitation means comprises rotating paddle wheels in each of said cells.

10. The plating apparatus of claim 7 for electroplating of through holes in a printed circuit board further comprising
ion replenishment means containing at least one piece of the metal to be plated within the plating solution for replenishing the ion content in the plating solution in said first cells;
first electrode means for providing electrical contact between a first terminal of a power supply and said at least one piece of metal to be plated; and
second electrode means for providing electrical contact between a second terminal of a power supply and the printed circuit board to be plated.

11. The plating apparatus of claim 10 wherein said ion replenishment means comprises baskets containing pieces of the metal to be plated in third cells coupled to said first cells and through which plating solution passes in flowing to said first cells.

12. The plating apparatus of claim 11 further comprised of fourth cells coupled to said second cells, and through which plating solution passes in flowing from said second cells to said pump means, said forth cells containing filter means for filtering of plating solution flowing therethrough.

13. Plating apparatus for the plating of through holes in a printed circuit board comprising
a container for confining a plating solution;
printed circuit board support means for supporting a printed circuit board within said container, reciprocating means coupled to said support means for providing repetitive movement of said circuit board held in said support means back and forth in a plane substantially coincident with the plane of said circuit board;
divider means adjacent each side of said printed circuit board support means for defining first and second cells along each side of said printed circuit board support means;
agitator means within each of said first cells for mechanically providing substantial agitation to a plating solution therein, said agitator means comprising rotating paddle wheels within each of said first cells;
pump means for delivering plating solution to said first cells and for removing plating solution from said second cells, said second cells being substantially opposite one of said first cells, whereby fresh plating solution will be urged to flow from said first cells through the through holes in a printed circuit board on said printed circuit board support means and into said second cells to provide fresh plating solution to inner surfaces of the through holes;
ion replenishment means containing at least one piece of a metal to be plated within the plating solution for replenishing the ion content in the plating solution in said first cells, said ion replenishment means comprising baskets containing pieces of the metal to be plated in third cells coupled to said first cells and through which plating solution passes in flowing to said first cells;

first electrode means for providing electrical contact between a first terminal of a power supply and said at least one piece of metal to be plated;

second electrode means for providing electrical contact between a second terminal of a power supply and the printed circuit board to be plated;

fourth cells coupled to said second cells, and through which plating solution passes in flowing from said second cells to said pump means, said fourth cells containing filter means for filtering of plating solution flowing therethrough.

14. The apparatus of claim 13 wherein the flow of plating solution in adjacent cells is in opposite directions.

* * * * *